United States Patent
Bao (10) Patent No.: US 8,981,757 B2
(45) Date of Patent: Mar. 17, 2015

(54) PHASE DETECTOR

(75) Inventor: Mingquan Bao, Vastra Frolunda (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 351 days.

(21) Appl. No.: 13/636,742

(22) PCT Filed: Mar. 25, 2010

(86) PCT No.: PCT/EP2010/053916
§ 371 (c)(1),
(2), (4) Date: Sep. 24, 2012

(87) PCT Pub. No.: WO2011/116822
PCT Pub. Date: Sep. 29, 2011

(65) Prior Publication Data
US 2013/0009627 A1    Jan. 10, 2013

(51) Int. Cl.
*G01R 25/00* (2006.01)
*H03L 7/085* (2006.01)
*H03D 13/00* (2006.01)

(52) U.S. Cl.
CPC ............. *H03L 7/085* (2013.01); *G01R 25/005* (2013.01); *H03D 13/00* (2013.01)
USPC ...................................... 324/76.77

(58) Field of Classification Search
CPC ............................. H03D 13/00; G01R 25/005
USPC ............... 324/76.77–76.91, 622; 333/25–26; 327/2–12
See application file for complete search history.

(56) References Cited

U.S. PATENT DOCUMENTS

| | | | |
|---|---|---|---|
| 4,888,558 A * | 12/1989 | Hereikson | 329/345 |
| 8,217,683 B2 * | 7/2012 | Le Guillou | 327/2 |
| 2008/0191657 A1 * | 8/2008 | Ichiki et al. | 318/729 |
| 2009/0267666 A1 * | 10/2009 | Marutani | 327/160 |
| 2010/0308793 A1 * | 12/2010 | Bhagavatheeswaran et al. | 324/76.82 |
| 2010/0321001 A1 * | 12/2010 | Ichiyama | 324/76.77 |

FOREIGN PATENT DOCUMENTS

| | | |
|---|---|---|
| FR | 2842369 A1 | 1/2004 |
| GB | 2356756 | 5/2001 |

* cited by examiner

*Primary Examiner* — Patrick Assouad
*Assistant Examiner* — Demetrius Pretlow
(74) *Attorney, Agent, or Firm* — Rothwell, Figg, Ernst & Manbeck, P.C.

(57) ABSTRACT

A phase detector (100, 400, 800) comprising a balun (150) and input ports (116) at each of the balun's balanced ports. The phase detector (100, 400, 800) has four devices (105, 115, 110, 155) for measuring a signal's amplitude: —a first device (105) at a first input port (116), —a second device (115) at a second input port (117), —a third device (110) between the input ports (116, 117), connected to the ports via a passive component (120, 125; 120', 125; 120", 125"), —a fourth device (155) at the unbalanced port of the balun (150), The difference between the amplitude values of the third (110) and fourth (155) devices indicate the phase difference and the difference between the amplitude values measured by the first (110) and second (115) devices indicates the phase difference in the region of 0-2π.

8 Claims, 6 Drawing Sheets

PHASE DETECTOR

CROSS-REFERENCE TO RELATED APPLICATION

This application is a 35 U.S.C. § 371 National Phase Entry Application from PCT/EP2010/053916, filed Mar. 25, 2010, and designating the United States, the disclosure of which is incorporated by reference herein.

TECHNICAL FIELD

The present invention discloses a phase detector which can work over an extended frequency range and in an extended phase interval.

BACKGROUND

The requirement to be able to measure the phase difference between two signals, for example two sinusoidal signals, occurs frequently in electronic systems. Examples of systems in which such measurements are needed are phase locked loops, PLLs, and in demodulation of phase-shift keyed signals, PSK-signals.

Known phase detectors include analog solutions such as Gilbert mixers and digital solutions such as logic circuit comprising logic gates and/or flip-flops. Such known solutions usually exhibit drawbacks either regarding the "phase region" or the frequency range in which they are effective.

SUMMARY

It is an objective of the present invention to obviate at least some of the disadvantages mentioned above in known phase detectors. This objective is accomplished by the present invention in that it discloses a phase detector for detecting a phase difference $\phi$ between a first and a second sinusoid signal of equal amplitude A.

The phase detector of the invention also comprises a balun and a first input port for the first signal at one of the balanced ports of the balun and a second input port for the second signal at the other of the balanced ports of the balun.

According to the invention, the phase detector is equipped with four devices for measuring a signal's amplitude, the four devices being arranged as follows:
  a first device at the first input port,
  a second device at the second input port,
  a third device at an intermediate point between the two input ports, connected to each of said input ports via a passive component of a first kind,
  a fourth device at the unbalanced port of the balun.

Either the intermediate point or the first and second input ports are connected to ground via a passive component of a second kind.

In the phase detector of the invention, the difference between the amplitude values measured by the third and fourth devices indicate the phase difference, and the difference between the amplitude values measured by the first and second devices indicates the phase difference in the region of 0-2π.

In an alternative embodiment, the invention discloses a phase detector for detecting a phase difference $\phi$ between a first sinusoid signal and a second sinusoid signal of equal amplitude A.

In this embodiment, the phase detector comprises a balun and a first input port for the first signal at one of the balanced ports of the balun and a second input port for the second signal at the other of the balanced ports of the balun. The phase detector is in this embodiment equipped with four devices for measuring a signal's amplitude, the four devices being arranged as follows:
  a first device at the first input port,
  a second device at the second input port,
  a power combiner which connects the input ports, with a third device at the combination output port of the combiner,
  a fourth device at the unbalanced port of the balun.

In this embodiment, the phase detector also comprises a first and a second coil, one from each of the input ports to ground, with each coil having a passive component of a second kind connect in parallel to it from the input port to ground.

In this embodiment of the phase detector, the difference between the amplitude values measured by the third and fourth devices indicates the phase difference, and the difference between the values measured by the first and second devices indicates the phase difference in the region of 0-2π.

By means of the invention, a phase detector is obtained which can operate over a wide frequency range, and which can resolve phase ambiguities over the entire range of 0-2π.

BRIEF DESCRIPTION OF THE DRAWINGS

The invention will be described in more detail in the following, with reference to the appended drawings, in which.

DETAILED DESCRIPTION

Figure 1:
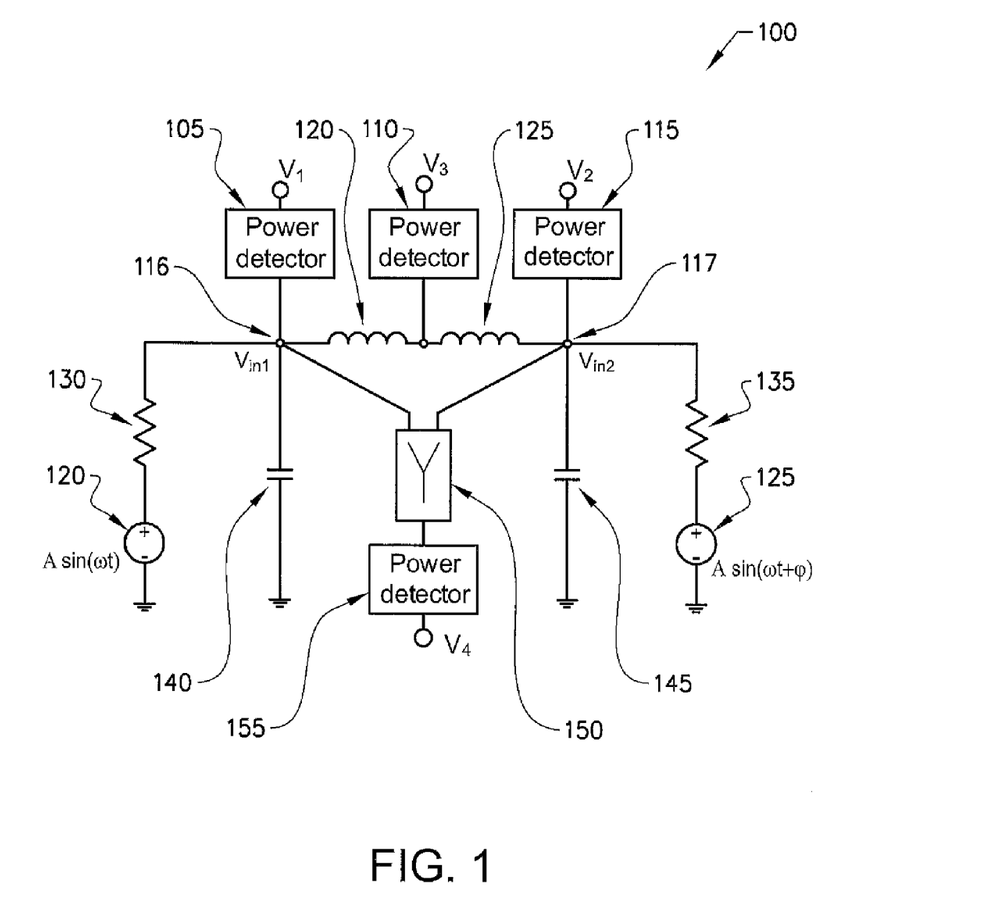
FIG. 1 shows a first embodiment of the invention.

FIG. 1 shows a first embodiment 100 of phase detector of the invention. The phase detector 100 comprises a first 116 and a second 117 input port, one for each of two signals, $V_{in1}$, $V_{in2}$, between which a phase difference $\phi$ can be measured. Two signal sources 120, 125 are also shown, one connected to each of the input ports 116, 117.

The phase detector 100 comprises a so called Π-network consisting of a first and a second capacitor 140, 145 i.e. two passive components of a second kind and a first and a second inductor 120, 125, i.e. two passive components of a first kind. Each of the capacitors 140, 145 is connected from one of the input ports 116, 117 to ground, and the two inductors 120, 125 are connected in series to each other between the two input ports 116, 117.

In addition, the Π-network is connected to the balanced ports of a balun 150 by means of one of the balanced ports of the balun being connected to a point in the Π-network between the first capacitor 140 and the first inductor 120, which here corresponds to the first input port 116, and the other of the balanced ports being connect to a point in the Π-network between the second capacitor 145 and the second inductor 125, which here corresponds to the second input port 117. This can also be seen as one of the balanced ports being connected to each of the input ports 116, 117 of the phase detector 100.

As mentioned, the phase detector 100 comprises a first 116 and a second 117 input port, with one input port for each of two signals between which a phase difference can be measured by means of the phase detector 100. A first sinusoid signal A*sin(ωt) from a first signal source 120 is shown as being connected at the input port 116, and a second sinusoid signal A*sin(ωt+φ) from a second signal source 125 is shown as being connected to the other of the input ports, 117. There is a phase difference of φ between the two input signals. Also shown in FIG. 1 is one resistor 130, 135, from each of the input signal sources, in this case via respective resistors 130, 135, which represent a resistance in the signal sources 120, 125.

The phase detector also comprises four devices 105, 110, 115, 155 for measuring a signal's amplitude. In the embodiment of FIG. 1 these devices are shown as being so called power detectors. As shown in FIG. 1, the power detectors are connected to enable measuring the signal amplitude at the following points in the phase detector 100:

a first power detector 105 at one of the balun's balanced ports for measuring an amplitude $v_1$, a second power detector 115 at the other of the balun's balanced ports for measuring an amplitude $v_2$, a third power detector 110 device at an intermediate point between the balun's balanced ports, connected to each of the first and second input ports 116, 117, via a passive component of a first kind, in this example inductors 120, 125. This power detector measures an amplitude $v_3$ a fourth power detector 155 at the unbalanced port of the balun for measuring an amplitude $v_4$.

As is also shown in FIG. 1, the intermediate point is connected to ground via a passive component of a second kind, in this example the capacitors 140, 145.

This configuration of the power detectors enables the following measurements to be made:

the difference between $|v_3|$ and $|v_4|$, or rather, between $|v_3|$ and $|v_4|$ indicates the value of the phase difference φ between the two input signals, the difference between $|v_1|$ and $|v_2|$, or rather, between $|v_1|$ and $|v_2|$ unambiguously indicates the phase difference in the entire region of 0-2π.

Figure 2:
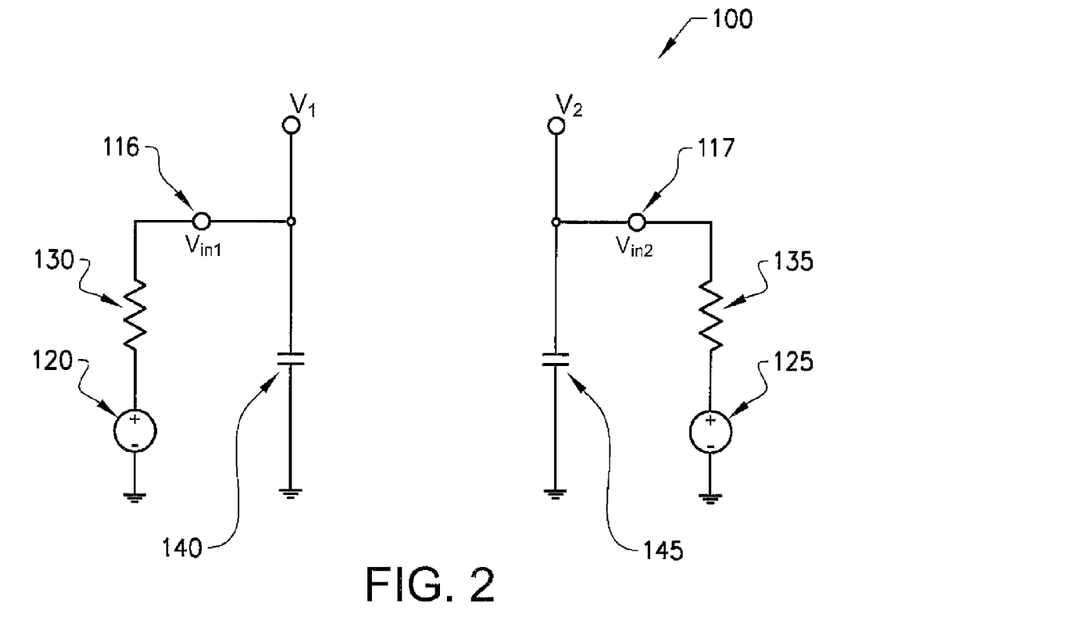
FIGS. 2 and 3 show equivalent circuits for the embodiment of FIG. 1 for different phase values.

Thus, the phase detector of the invention enables accurate measurements of the phase difference φ over the entire region of 0-2π. The function of the phase detector 100 will now be described in more detail, with reference to FIGS. 2 and 3 which show equivalent circuit diagrams for the phase detector 100 of FIG. 1 for the phase difference φ being equal to zero and π, i.e. the two "two extreme cases":

The two signals between which a phase difference φ is to be measured are input at the input ports 116 and 117. Looking first at one "extreme" case, i.e. the case where the phase difference φ is zero, the excitation of the π-network will be in so called "common-mode". In such a case, there is no current flow through the inductors 120 and 125, and a circuit diagram of an equivalent circuit to the phase detector in this case (φ=0) is shown in FIG. 2. The impedance Z of the π-network is determined by the capacitors 140 and 145 only, as shown in FIG. 2, and is given by the following expression, where C is the capacitance of the capacitor 140 or 145:

$$Z = \frac{1}{j\omega C} \text{ for } \phi = 0; \quad (1)$$

Figure 3:
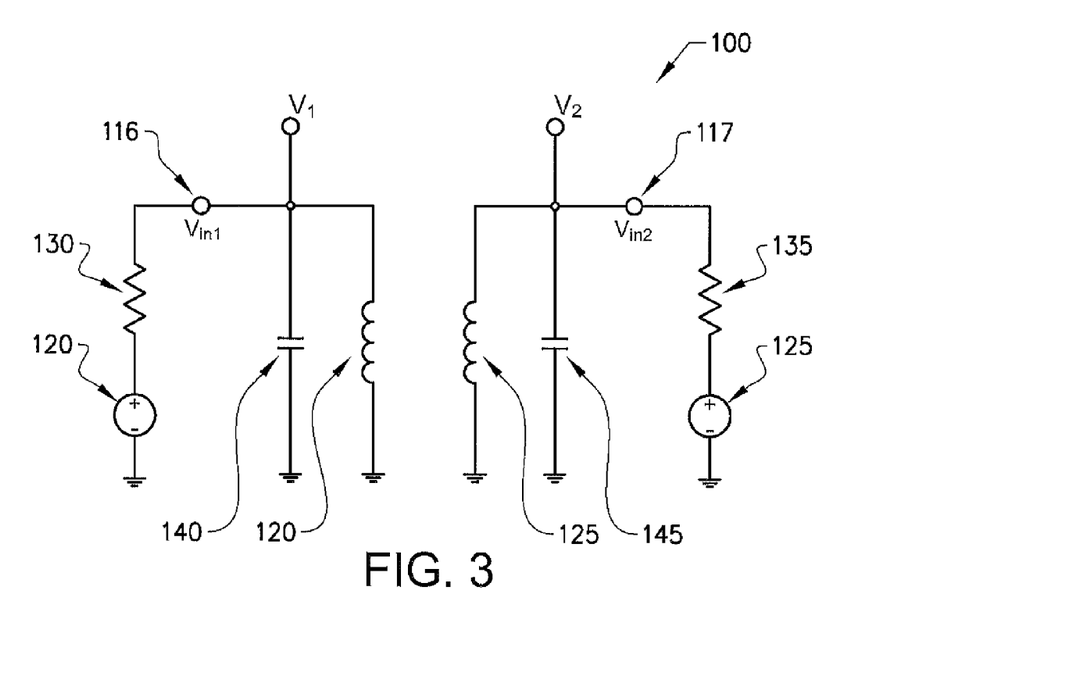

Turning now to another "extreme" case, i.e. the case where the phase difference φ between the input signals at the ports 116 and 117 is π, the π-network is excited by a so called differential mode signal, and a point between the inductors 120 and 125 in FIG. 1 is a virtual ground. FIG. 3 shows a circuit diagram of an equivalent circuit for the case where φ=π. In this case, the impedance of the π-network is determined by parallel LC pairs comprising the inductors 120, 125 and the capacitors 140, 145, as shown in FIG. 3. The impedance Z of the π-network can in this case (φ=π) be written as:

$$Z = \frac{L}{C} \frac{1}{\left(j\omega L + \frac{1}{j\omega C}\right)} \text{ for } \phi = \pi; \quad (2)$$

where L is the inductance of the inductor 120 or 125, and C is the capacitance of the capacitor 140 or 145.

From equations (1) and (2), it can be found that L and C determine the common- and differential-mode gains, $$g_{c,d} = \frac{V_{c,d}}{V_{in}},$$

where $V_{c,d}$ is the voltage at the input ports 116 or 117 in common- or differential-mode. The amplitude of $|v_1|$ will have different values in the two modes, as will the amplitude of $|v_2|$.

When φ is neither 0 or π, the π-network is excited by both common- and differential mode signals simultaneously, which are given by, $$V_{in,common} = \frac{V_{in} + V_{in}\exp(j\phi)}{2} \quad (3)$$

$$V_{in,differential} = \frac{V_{in} - V_{in}\exp(j\phi)}{2} \quad (4)$$

It can be found that $V_{in,common}$ and $V_{in,differential}$ are functions of φ. The voltages of $V_1$ $V_2$, $V_3$ and $V_4$ are response functions to common- and differential inputs, $V_{in,common}$ and $V_{in,differential}$, thus, their amplitudes are functions of the phase difference φ.

An example will now be given, which will show the variation of the amplitude of the voltages $|V_1|$-$|V_4|$ versus the phase difference φ. Assume a π-network as shown in FIG. 1, where a "center tapped" 0.5 nH-inductor is used as the inductors 120 and 125 and two 60 fF-capacitors are used as the capacitors 140 and 145, together with a transformer balun as the balun 150 in order to obtain the voltage $V_4$. The amplitude differences between $|V_3|$ and $|V_4|$ as a function of the phase difference φ is plotted in FIG. 4, and is, as can be seen, a quasi-linear function of the phase difference over the region of (0, π) and (π, 2π).

Figure 4:
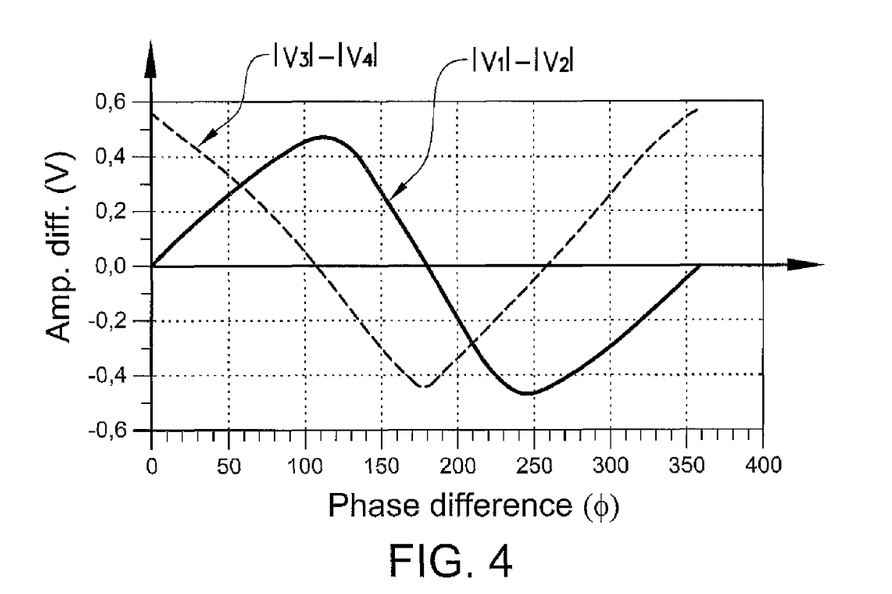
FIGS. 4 and 5 show diagrams explaining the function of the invention.

The symmetry of the function shown in FIG. 4 around φ=π gives rise to an ambiguity in the region of (0, 2π). In other words, there are two phase values φ and 2π-φ, which both correspond to a given amplitude difference between $|v_3|$ and $|v_4|$. This ambiguity limits the detecting region within (0, π). In order to resolve this ambiguity, one more amplitude difference, $|V_1|$-$|V_2|$ is used in a phase detector of the invention. This amplitude difference is a function of the phase difference φ, as shown in FIG. 4, and is asymmetric about φ=π. In the case where $|V_1|$-$|V_2|$ is larger than 0, the phase difference φ is in the region of (0, π); otherwise, it is in the region of (π, 2π). Consequently, from the sign of $|V_1|$-$|V_2|$, the ambiguity of the phase difference φ is solved, and consequently, by utilizing both the difference $|V_1|$-$|V_2|$ and $|V_3|$-$|V_4|$, the inventive phase detector can measure the phase difference φ unambiguously in the entire range of 0 to 2π.

As mentioned, the amplitude difference of |V₃|-|V₄| as a function of the phase difference φ is a quasi-linear curve. This feature, together with the non-ambiguity makes the inventive phase detector suitable for use in demodulation of higher-order Phase-shift keying (PSK) signals, for example QPSK signals, Quadrature PSK signals, 8PSK signals, etc.

Figure 5:
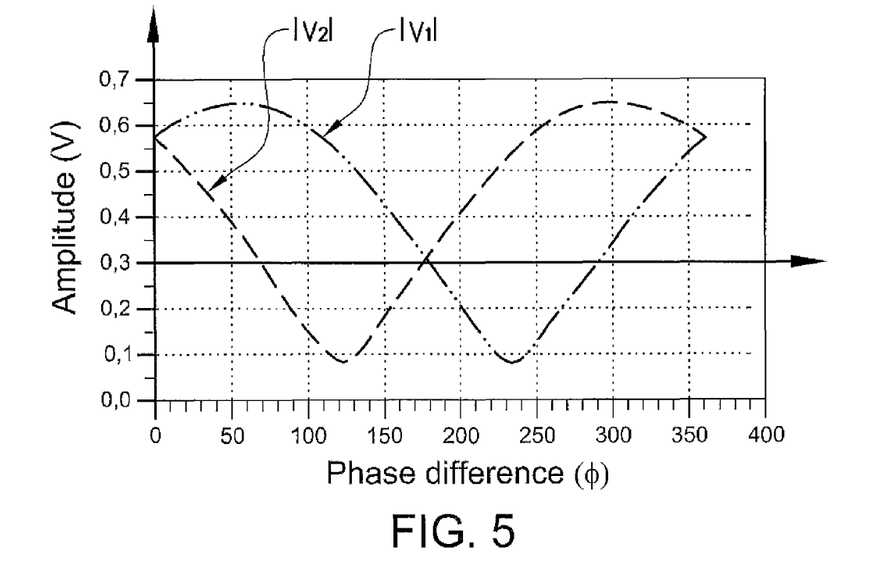

When applying the inventive phase detector for demodulation of QPSK signals, suitably only the amplitudes of |V₁| and |V₂| are used, for reasons of simplicity. FIG. 5 shows the amplitudes of |V₁| and |V₂| as a function of the phase difference φ. When the phase difference is equal to π/2, the amplitude of |V₁| is significantly larger than that of |V₂|, and vice versa when the phase difference is equal to 3π/2. When the phase difference is equal to π, the amplitudes of |V₁| and |V₂| are equal and both are small; when the phase difference is equal to 0 or 2π, the amplitudes of |V₁| and |V₂| are equal, and both are large. Thus, a QPSK signal can be demodulated using the inventive phase detector, based on the amplitudes of |V₁| and |V₂| and their differences.

Figure 6:
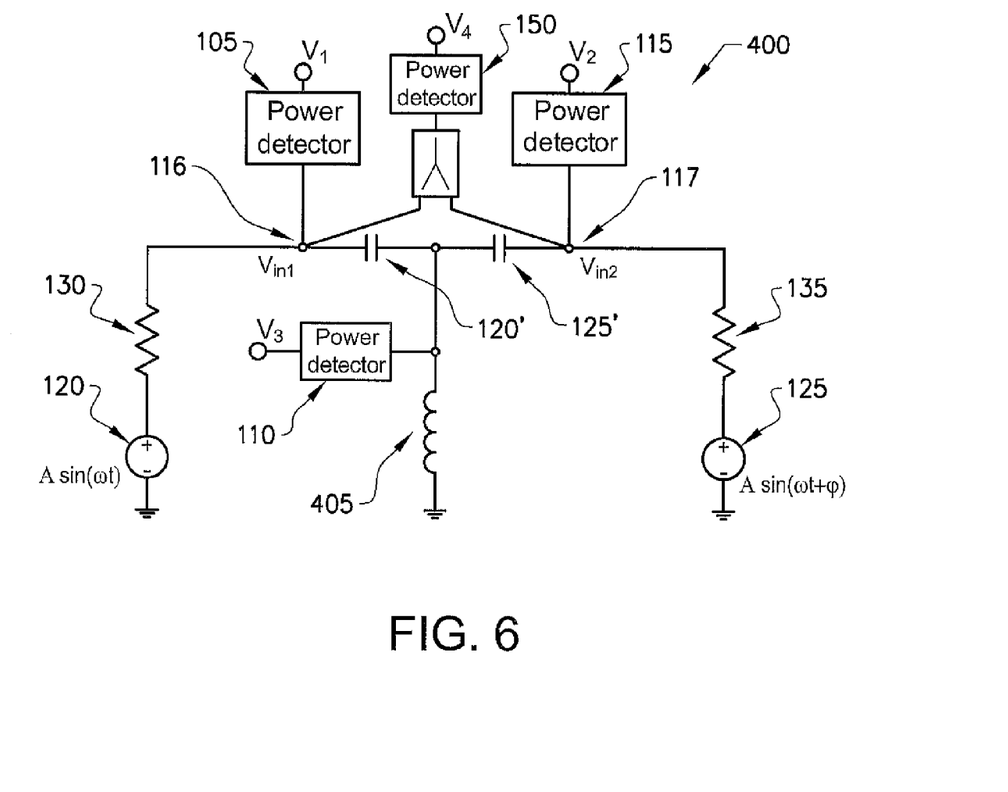
FIG. 6 shows a second embodiment of the invention.

In the embodiment shown in FIG. 1, a π-network is used to obtain the amplitudes $V_1$, $V_2$, $V_3$ and $V_4$. An alternative embodiment 400 is shown in FIG. 6, where the reference numbers from FIG. 1 have been retained for corresponding components: here, a so called T-network is used instead of a π-network, but the same principle is utilized as in FIG. 1: signals A*sin(ωt) and second signal A*sin(ωt+φ) are connected to the balanced ports of the balun 150, and are serially connected to each other via capacitors 120' and 125'. At a point between the capacitors 120 and 125, the voltage $V_3$ is accessed, and this point is also connected to ground via an inductor 405. In similarity to the embodiment 100 of FIG. 1, the voltage $V_4$ is accessed at the unbalanced port of the balun 150.

Figure 7:
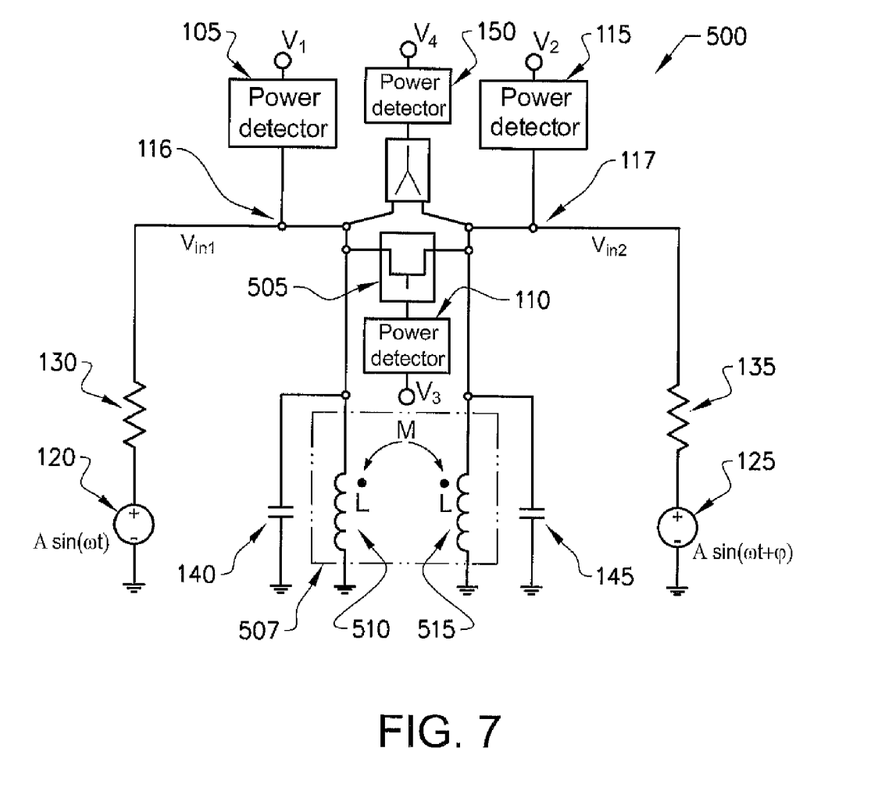
FIG. 7 shows a third embodiment of the invention.

FIG. 7 shows a further embodiment 500 of a phase detector of the invention: In this embodiment, the π-network or T-network has been replaced by a transformer 507 with two windings 510, 515, each in parallel with respective capacitors 140, 145 and a power combiner 505 which connects to the balanced ports of the balun 150; the voltage $V_3$ is accessed at the "combination port" of the combiner 505.

The function of this embodiment can be described as follows:

In the two windings 510, 515 of the transformer 507, the two voltages, $V_1$ and $V_2$ apply, together with respective currents $I_1$ and $I_2$, and:

$$V_1 = j\omega L_1 I_1 + j\omega M I_2 \quad (7)$$

$$V_2 = j\omega M I_1 + j\omega L_2 I_2 \quad (8)$$

where $L_1$ and $L_2$ are self-inductance of the two windings and M is the mutual inductance between the two windings 510, 515. When the transformer 507 is excited by a common-mode signal, its total inductance at a winding is equal to $L_i+M$ (i=1,2); when the transformer 507 is excited by a differential signal, its total inductance becomes $L_i-M$ (i=1,2). Thus, the transformer 507 demonstrates different gains for common- and differential-modes, due to the mutual inductance. This will result in the amplitudes of $V_1, \ldots, V_4$ being functions of the phase difference φ in the same manner as explained above in connection to the corresponding voltages $V_1, V_2, V_3$ and $V_4$ in connection to FIGS. 1-5.

Returning now to the embodiments 100 and 400 shown in FIGS. 1 and 6, the following can be said: these embodiments comprise a π-network or a T-network, which in turn comprises a number of passive components, such as, for example, the inductors 120 and 125, and the capacitors 140, 145, in FIG. 1 and the capacitors 120', 125' and the inductor 405 of FIG. 6. These components are all passive components, and in a phase detector of the invention, the type of passive component can be changed with retained function. In other words, the inductors 120 and 125, as well as the capacitors 140, 145, can be replaced "pair-wise" with passive components of other kinds, and the inductor 405 can be replaced with another passive component. Well known examples of passive components are capacitors, resistors and inductors. As an example of the "replacement principle", the inductors 120, 125 can be replaced with capacitors, or the capacitors 140, 145 can be replaced with resistors.

Figure 8:
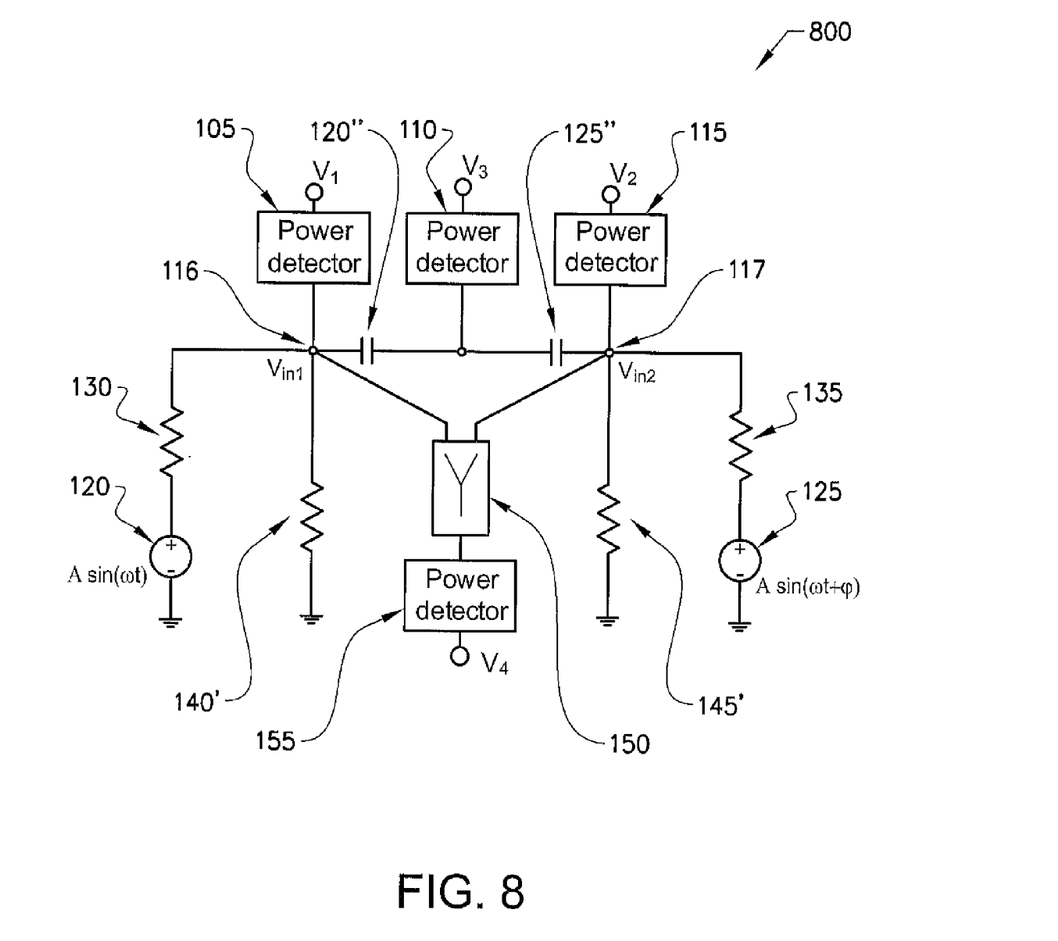
FIG. 8 shows a fourth embodiment of the invention.

In order to further illustrate this principle, FIG. 8 shows an alternative embodiment 800 of the phase detector 100 shown in FIG. 1. The reference numbers from FIG. 1 have been retained for corresponding components. As shown in FIG. 8, the capacitors 140, 145 have been replaced by resistors 140', 145' and the inductors 120, 125 have been replaced by capacitors 120", 125".

Turning now to the issue of the passive components which are used in the invention, the following can be said: the passive components which have been identified above as being of the same kind, i.e. a first kind or a second kind, should be the same kind of passive component, but the kind can be chosen freely from the various kinds of passive components which exist, examples of which are the following:

Resistors
Capacitors
Inductors

As an example, looking at the detector 100 of FIG. 1, the passive components of the first kind, i.e. the inductors 120, 125, can be replaced by, for example, resistors. In such a case however, the passive components which have been identified as being of the second kind, i.e. the inductors 140, 145, should not be chosen as being resistors, but components of a passive kind which are not resistors, e.g. capacitors or inductors.

Regarding the "value" of the passive components of the invention, two components which have been identified above as being of the same kind and belonging to the same embodiment should preferably be chosen to be of the same value, i.e. the same resistance, inductance or capacitance. This is however a preference and not a must, a man skilled in the field will realize how the principle of the invention can be utilized by using passive components of the same kind but of differing "value". However, in some embodiments, at least two of the passive components of the first kind and/or of the second kind are of differing values.

The invention is not limited to the examples of embodiments described above and shown in the drawings, but may be freely varied within the scope of the appended claims.

The invention claimed is:

1. A phase detector for detecting a phase difference between a first sinusoid signal and a second sinusoid signal of equal amplitude A, the phase detector comprising a balun and a first input port for the first signal at one of the balanced ports of the balun and a second input port for the second signal at the other of the balanced ports of the balun, the phase detector being equipped with four devices for measuring a signal's amplitude, said four devices being arranged as follows:
 a first device at the first input port,
 a second device at the second input port,
 a third device at an intermediate point between the two input ports, connected to each of said input ports via a passive component of a first kind,
 a fourth device at the unbalanced port of the balun, with either the intermediate point or the first and second input ports being connected to ground via a passive component of a second kind, wherein the difference between the amplitude values measured by the third and fourth devices indicate the phase difference and the difference between the amplitude values measured by the first and second devices indicates the phase difference in the region of $0$-$2\pi$.

2. The phase detector claim 1, in which the first kind of passive components are chosen from among the following kinds:

Resistors,

Capacitors, and

Inductors.

3. The phase detector of claim 1, in which the first kind of passive components are all of the same value.

4. The phase detector of claim 1, in which at least two of the passive components of the first kind are of differing values.

5. The phase detector of claim 1, in which the second kind of passive components are chosen from among the following kinds: Resistors, Capacitors, and Inductors.

6. The phase detector of claim 1, in which the second kind of passive components are all of the same value.

7. The phase detector of claim 1, in which at least two of the passive components of the second kind are of differing values.

8. A phase detector for detecting a phase difference between a first sinusoid signal and second sinusoid of equal amplitude A, with the phase detector comprising a balun and a first input port for the first signal at one of the balanced ports of the balun and a second input port for the second signal at the other of the balanced ports of the balun, the phase detector being equipped with four devices for measuring a signal's amplitude, said four devices being arranged as follows:

a first device at the first input port, a second device at the second input port, a power combiner which connects the input ports, with a third device at the combination output port of the combiner, a fourth device at the unbalanced port of the balun, the phase detector also comprising a first and a second coil, one from each of the input ports to ground, each of said coils having a passive component of a second kind connect in parallel to it from the input port to ground, wherein the difference between the amplitude values measured by the third and fourth devices indicates the phase difference, and the difference between the values measured by the first and second devices indicates the phase difference in the region of $0$-$2\pi$.

\* \* \* \* \*